(12) United States Patent
Raaijmakers et al.

(10) Patent No.: US 7,018,504 B1
(45) Date of Patent: Mar. 28, 2006

(54) LOADLOCK WITH INTEGRATED PRE-CLEAN CHAMBER

(75) Inventors: Ivo Raaijmakers, Bilthoven (NL); Ravinder Aggarwal, Gilbert, AZ (US); James Kusbel, Fountain Hills, AZ (US)

(73) Assignee: ASM America, Inc., Phoenix, AZ (US)

( * ) Notice: Subject to any disclaimer, the term of this patent is extended or adjusted under 35 U.S.C. 154(b) by 726 days.

(21) Appl. No.: 09/658,784

(22) Filed: Sep. 11, 2000

(51) Int. Cl.
*C23F 1/00* (2006.01)
*H01L 21/306* (2006.01)
*C23C 16/00* (2006.01)

(52) U.S. Cl. .......................... 156/345.31; 156/345.32; 156/345.22; 118/729

(58) Field of Classification Search ................ 118/719, 118/728, 730; 156/345; 414/217, 214, 217.1, 414/805; 29/25.01; 427/575, 237; 438/694; 117/708, 90; 141/93; 204/298.06
See application file for complete search history.

(56) References Cited

U.S. PATENT DOCUMENTS

| | | | |
|---|---|---|---|
| 4,895,107 A * | 1/1990 | Yano et al. .................. 118/722 |
| 4,951,601 A | 8/1990 | Maydan et al. .............. 118/719 |
| 5,071,460 A * | 12/1991 | Fujiura et al. ................ 65/388 |
| 5,080,549 A | 1/1992 | Goodwin et al. .......... 414/744.8 |
| 5,223,001 A * | 6/1993 | Saeki ......................... 29/25.01 |
| 5,391,035 A * | 2/1995 | Krueger .................... 414/217.1 |
| 5,520,742 A * | 5/1996 | Ohkase ........................ 118/725 |
| 5,520,743 A * | 5/1996 | Takahashi .................... 118/730 |
| 5,538,390 A * | 7/1996 | Salzman ...................... 414/805 |
| 5,571,330 A | 11/1996 | Kyogoku ..................... 118/719 |
| 5,586,585 A * | 12/1996 | Bonora et al. ................. 141/93 |
| 5,609,459 A | 3/1997 | Muka ....................... 414/217.1 |
| 5,613,821 A | 3/1997 | Muka et al. .............. 414/217.1 |
| 5,630,690 A * | 5/1997 | Salzman ................... 414/217.1 |
| 5,664,925 A | 9/1997 | Muka et al. .............. 414/217.1 |
| 5,683,072 A * | 11/1997 | Ohmi et al. ................. 251/193 |
| 5,697,750 A | 12/1997 | Fishkin et al. ........... 414/217.1 |
| 5,730,801 A | 3/1998 | Tepman et al. ............. 118/719 |
| 5,752,796 A | 5/1998 | Muka ....................... 414/217.1 |
| 5,810,538 A | 9/1998 | Ozawa et al. ................ 414/217 |
| 5,857,848 A | 1/1999 | Takahashi et al. .......... 432/253 |
| 5,883,017 A | 3/1999 | Tepman et al. ............. 438/800 |
| 5,885,675 A | 3/1999 | Martin ...................... 428/36.5 |

(Continued)

FOREIGN PATENT DOCUMENTS

EP         0834907 A2 *  8/1998

(Continued)

*Primary Examiner*—Rudy Zervigon
(74) *Attorney, Agent, or Firm*—Knobbe Martens Olson & Bear LLP

(57) ABSTRACT

A wafer carrier adapted to hold a plurality of wafers and is positioned on an elevator plate in a load lock. The elevator plate is adapted to move between a first position with the carrier in a first chamber of the load lock and a second position with the carrier in the auxiliary chamber. In the second position, the elevator plate substantially seals the auxiliary chamber from the first chamber. In use, a first wafer is placed onto the wafer carrier. The wafer carrier can moved into the auxiliary chamber before or after the first wafer is placed onto the wafer carrier. The first wafer is auxiliary processed in the auxiliary chamber. A second wafer is placed onto the wafer carrier. Preferably after the second wafer is placed onto the wafer carrier, the first wafer is removed from the load lock. A third wafer is preferably then placed onto the wafer carrier so that the second wafer can cool. The second wafer is then removed from the load lock. The cycle is repeated.

16 Claims, 17 Drawing Sheets

U.S. PATENT DOCUMENTS

| | | | | |
|---|---|---|---|---|
| 6,022,586 A | * | 2/2000 | Hashimoto et al. | 427/237 |
| 6,048,154 A | * | 4/2000 | Wytman | 414/214 |
| 6,053,686 A | | 4/2000 | Kyogoku | 414/217 |
| 6,074,538 A | * | 6/2000 | Ohmi et al. | 204/298.06 |
| 6,096,135 A | * | 8/2000 | Guo et al. | 118/729 |
| 6,234,107 B1 | * | 5/2001 | Tanaka et al. | 118/723 R |
| 6,264,804 B1 | * | 7/2001 | Lee et al. | 204/192.12 |
| 6,280,134 B1 | * | 8/2001 | Nering | 414/217 |
| 6,283,060 B1 | * | 9/2001 | Yamazaki et al. | 118/723 E |
| 6,464,825 B1 | * | 10/2002 | Shinozaki | 156/345.55 |

FOREIGN PATENT DOCUMENTS

JP        06-275703   *   9/1994

* cited by examiner

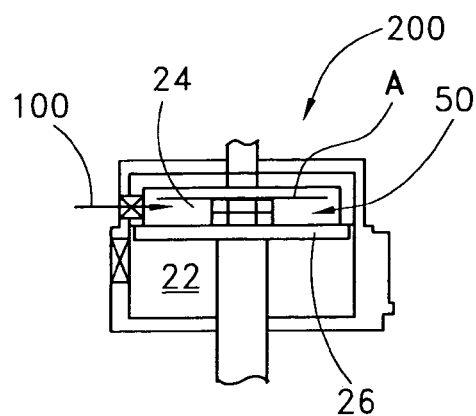
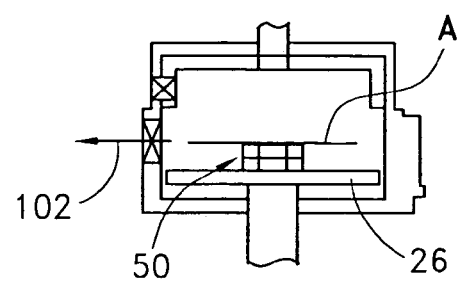
FIG. 9A
FIG. 9B
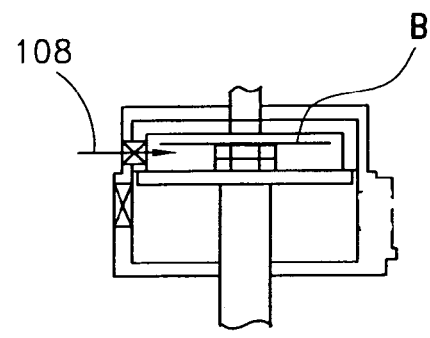
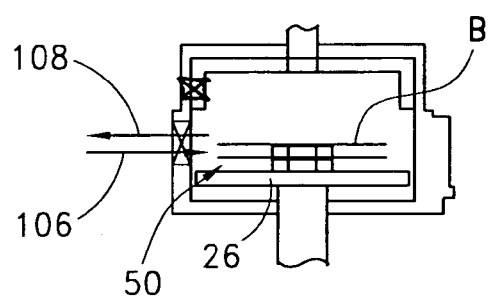
FIG. 9C
FIG. 9D
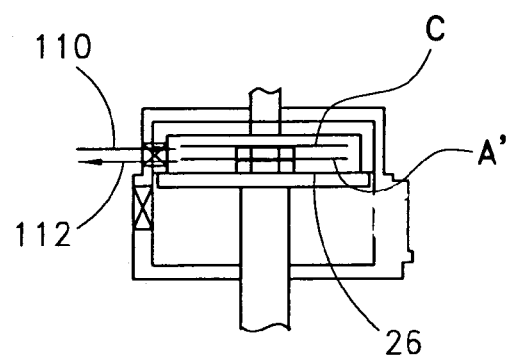
FIG. 9E

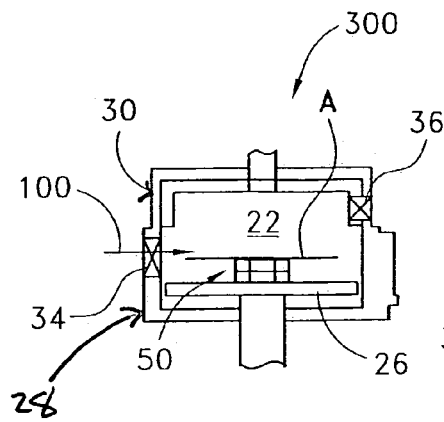
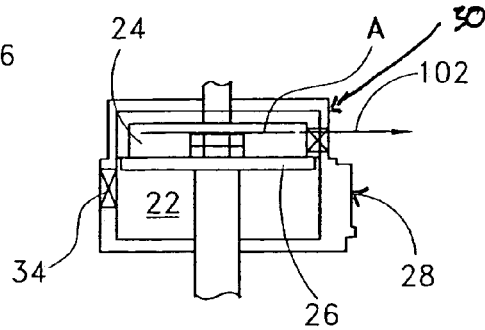
FIG. 10A  FIG. 10B
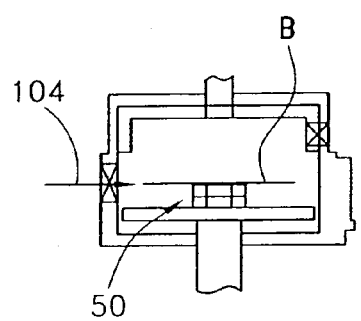
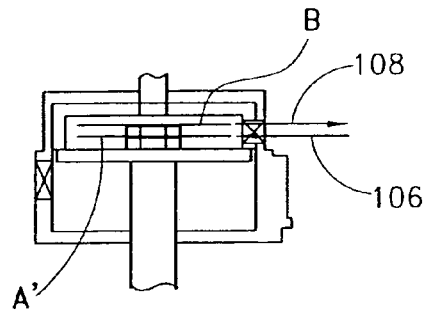
FIG. 10C  FIG. 10D
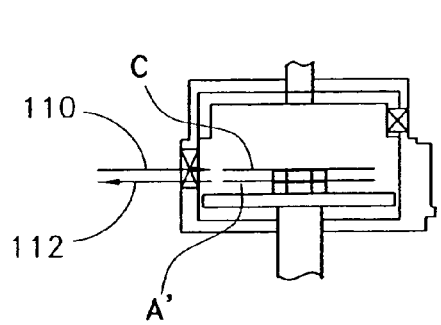
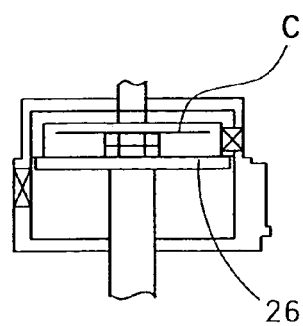
FIG. 10E  FIG. 10F

LOADLOCK WITH INTEGRATED PRE-CLEAN CHAMBER

BACKGROUND OF THE INVENTION

1. Field of the Invention

The present invention relates to a system and method for handling and processing semiconductor wafers and, in particular, to a load lock apparatus with an integrated staging shelf and an auxiliary module.

2. Description of the Related Art

In the processing of semiconductor devices, such as transistors, diodes, and integrated circuits, a plurality of such devices are fabricated simultaneously on a thin slice of semiconductor material, termed a substrate or wafer. When manufacturing these devices, it is imperative that the wafer does not become contaminated by particulate. Accordingly, wafer processing systems typically include a load lock apparatus that provides a substantially particle free environment from which wafers may be selectively withdrawn by a wafer handling assembly for placement into one or more processing modules.

To further improve the quality of wafer processing, it may be advantageous to pre-clean or measure the wafer before the wafer is processed in a process module. If such pre-cleaning or measuring is desired, an auxiliary module can be added to an existing wafer processing station. There are, however, several disadvantages associated with adding an auxiliary module to an existing wafer processing station. For example, adding an auxiliary module to an existing wafer processing station typically increases the footprint of the wafer processing station. Moreover, the auxiliary module also typically requires additional handling of the wafers and/or modifications to the wafer handling assembly. Furthermore, the addition of the auxiliary module typically decreases the throughput of the processing station. For example, in a cluster type processing station, one or more of the processing modules may have to be replaced. Similarly, in a stand alone type processing station, adding a pre-cleaning or measuring process typically increases the amount of time that a wafer is in a particular processing station.

SUMMARY OF THE INVENTION

Accordingly, one aspect of the present invention involves a load lock that defines at least partially a first chamber and an auxiliary chamber. The load lock comprises a first and second ports for moving a wafer into and out of the load lock. An elevator plate is located within the load lock and includes a wafer carrier that is adapted for receiving a plurality of wafers. The wafer carrier is moveable between a first position where the wafer carrier is in the first chamber and a second position where the wafer carrier is in the auxiliary chamber and the elevator plate substantially seals the auxiliary chamber from the first chamber.

Another aspect of the present invention involves a method of processing semiconductor wafers. A first wafer is placed onto a wafer carrier. The wafer carrier is moved into an auxiliary chamber of the load lock. The first wafer is auxiliary processed in the auxiliary chamber of the load lock. A second wafer is placed onto the wafer carrier. The first wafer is removed from the load lock.

In accordance with another aspect of the invention, a system is provided for processing substrates. The system includes a load lock chamber that has a lower portion and a narrower upper portion. The load lock chamber also includes two ports sized to pass substrates through them, and a moveable platform that is configured to support at least one substrate on it. The platform is narrower than the lower portion but wider than the upper portion, thus enabling the platform to selectively seal the upper portion while it supports a substrate upon it. The system also includes a substrate handling chamber that selectively communicates with the load lock chamber through the first port. In addition, at least one process chamber selectively communicates with the substrate handling chamber.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIGS. 9A–9E is a schematic representation of a method having certain features and advantages according to the present invention for handling and processing wafers, using the load lock of FIG. 8;

FIGS. 10A–10F is a schematic representation of a modified arrangement of a load lock having certain features and advantages according to the present invention and of a method having certain features and advantages according to the present invention for handling and processing wafers using the modified arrangement of the load lock;

DETAILED DESCRIPTION OF THE PREFERRED EMBODIMENT

Figure 1:
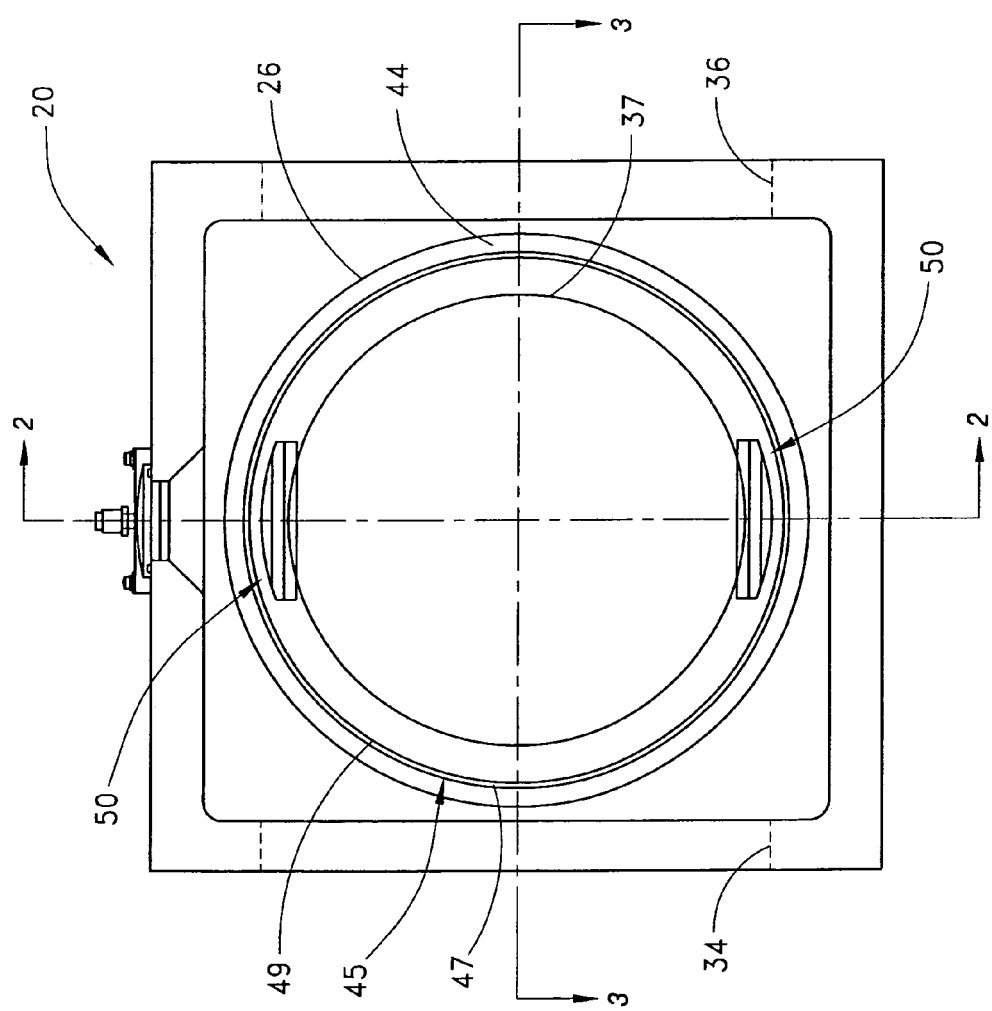
FIG. 1 is a top plan view of a load lock and an elevator plate having certain features and advantages according to the present invention.

FIGS. 1–3 illustrate a load lock 20 having certain features and advantages according to the present invention. As will be explained in more detail below, the load lock 20 is part of a wafer processing system. In such a system, the load lock 20 is typically located adjacent a wafer handling module, which transfers wafers to and from a wafer processing module.

Figure 2A:
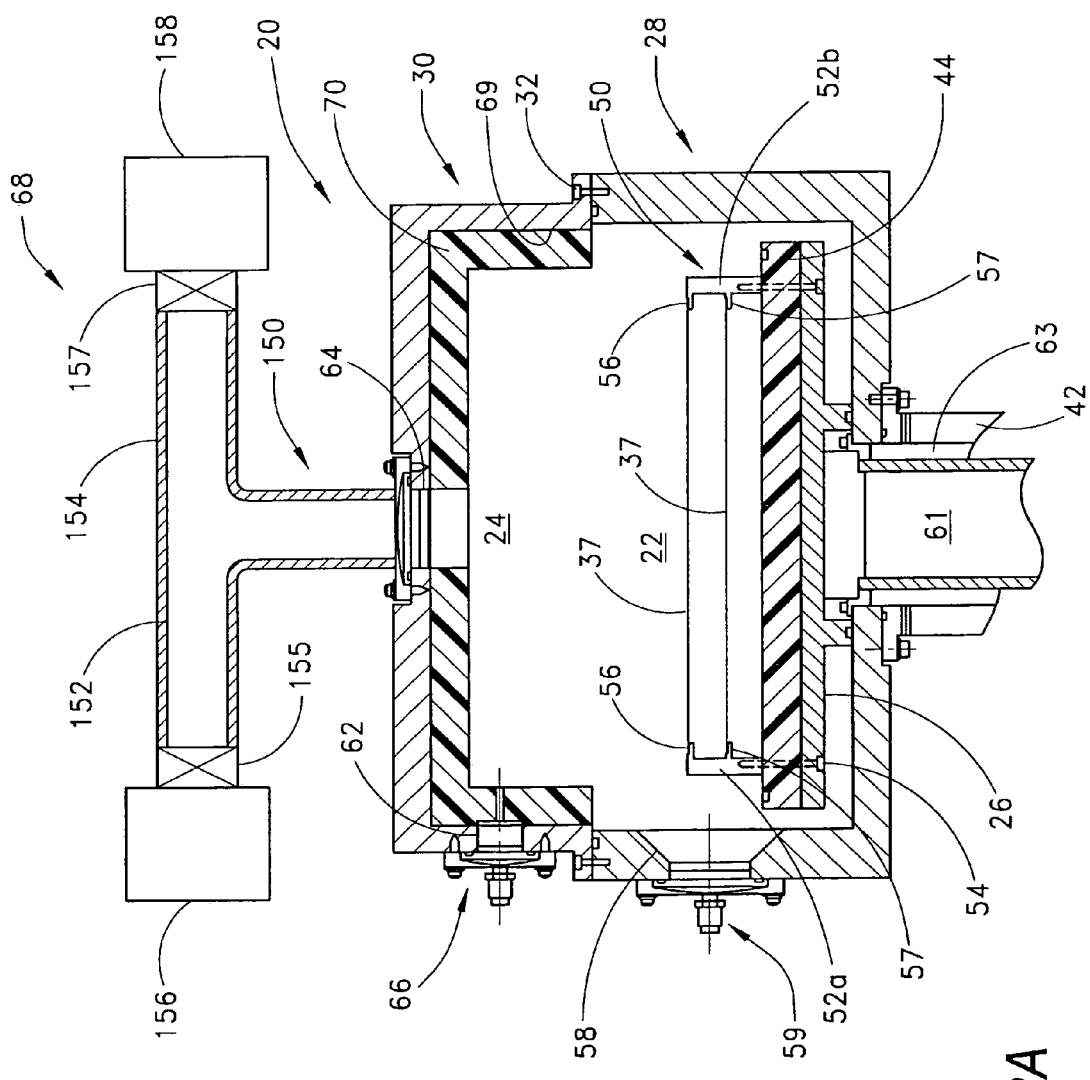
FIG. 2A is a cross-sectional view of the load lock and elevator plate of FIG. 1 taken along line 2—2, with the elevator plate in a lowered position.
Figure 2B:
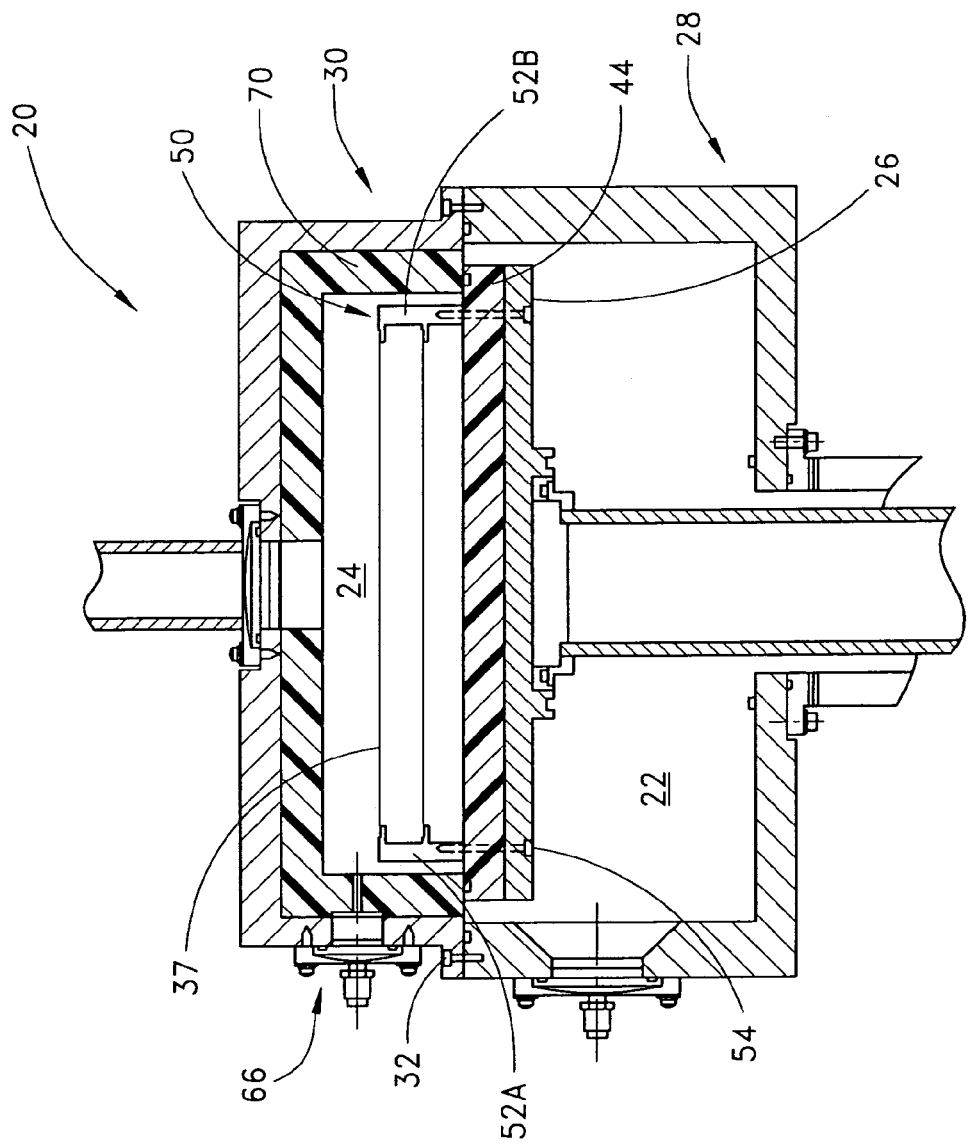
FIG. 2B is a cross-sectional view of the load lock and elevator plate of FIG. 1 taken along line 2—2, with the elevator plate in a raised position.

With initial reference to FIGS. 2A and 2B, the load lock 20 defines a first chamber, which is indicated generally by the reference number 22, and an auxiliary chamber 24, which is indicated generally by the reference number 24. The load lock 20 includes an elevator plate 26 that can be moved between a first position, which is illustrated in FIG. 2A, and a second position; which is illustrated in FIG. 2B. In the illustrated embodiment, the inner walls of the auxiliary chamber 24 are narrower than those of the first chamber 22. As will be explained in more detail below, when the elevator plate is in the second position, the elevator plate 26 substantially seals the auxiliary chamber 24 from the first chamber 22.

Preferably, the illustrated load lock 20 comprises a first housing portion 28 attached to an auxilary housing portion 30 by suitable fasteners 32. The first housing portion 28, auxiliary housing portion 30 and elevator plate 26 are preferably machined from aluminum, Ni-coated aluminum, or other such non-corrosive material to reduce the amount of particulate generated within the load lock 20.

Figure 3A:
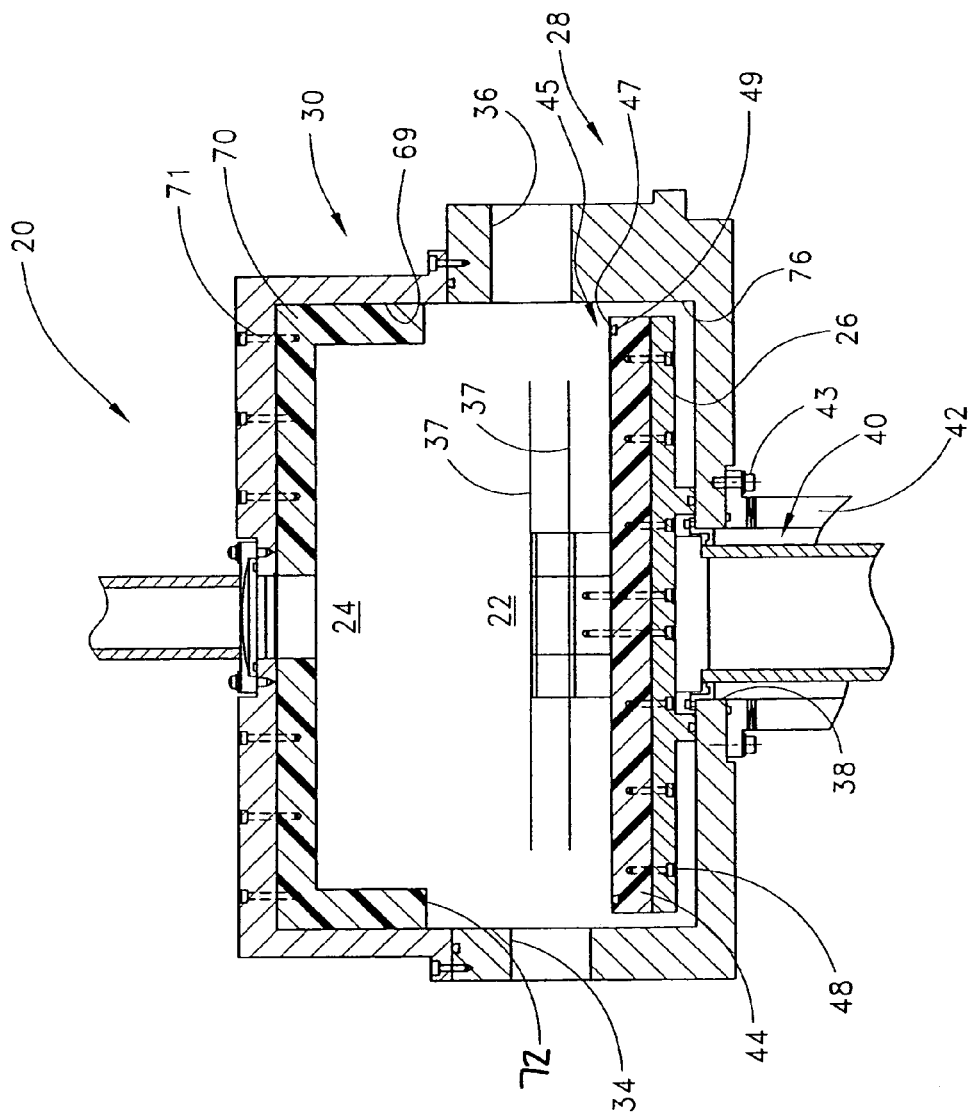
FIG. 3A is a cross-sectional view of the load lock and the elevator plate of FIG. 1 taken along line 3—3, with the elevator plate in the lowered position.
Figure 3B:
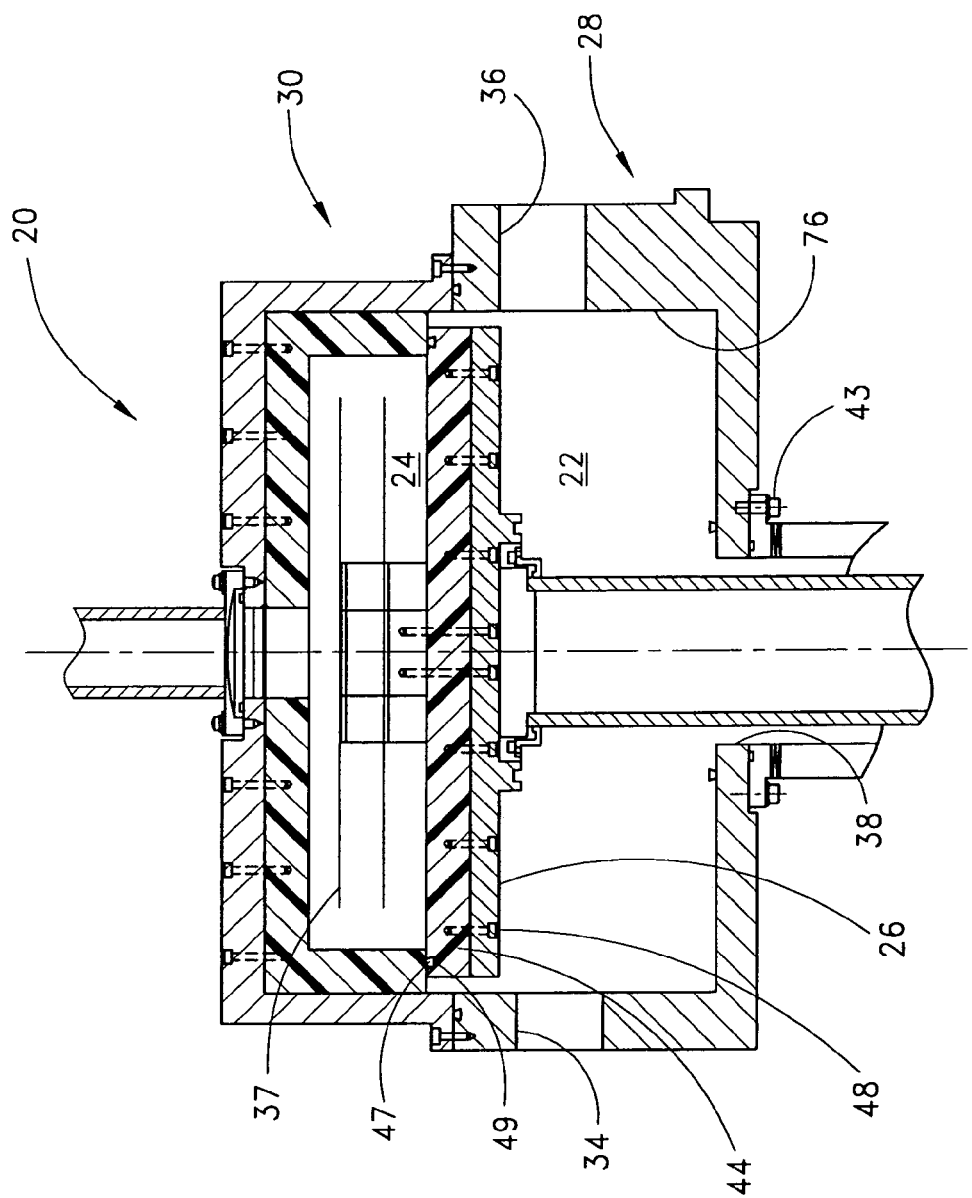
FIG. 3B is a cross-sectional view of the load lock and the elevator plate of FIG. 1 taken along line 3—3, with the elevator plate in the raised position.

With reference to FIG. 3A the load lock 20 includes a load lock port 34 and a handling chamber port 36, which are sufficiently wide to allow transport of wafers 37 therethrough. The load lock 20 also includes a lower circular aperture 38 through which an elevator shaft 40 (shown partially) extends. A housing 42 (shown partially) surrounds the shaft 40 and is secured to the to the load lock 20 by fasteners 43.

The elevator shaft 40 is coupled to the elevator plate 26. The elevator shaft 40 is also coupled to an elevator drive mechanism (not shown) such as the one disclosed in U.S. patent application entitled MULTIPOSITION LOAD LOCK CHAMBER, Ser. No. 09/113,767, filed Jul. 10, 1998 and U.S. patent application entitled DUAL POSITION LEVELING, Ser. No. 09/624,127, filed Jul. 24, 2000 which are hereby incorporated by reference. The elevator drive mechanism and the elevator shaft 40 are adapted to move the elevator plate 26 between the first and second positions. The elevator drive mechanism can be a conventional elevator drive mechanism that utilizes, for example, a feed screw and motor. The elevator drive mechanism is preferably controlled by a computer (not shown) that is adapted for controlling the movement of the elevator plate 26. Such elevator drive mechanisms are well known in the art; therefore, a detailed description of the elevator drive mechanism is not needed.

Preferably, the elevator plate 26 includes a lining 44 that at least partially covers the upper surface of the elevator plate 26. In the preferred embodiment, the lining 44 is made from Teflon® (i.e., polytetrafluoroethylene); although, other suitable non-reactive materials can also be used. Preferably, the lining 44 is removably secured to the elevator plate 26 by fasteners 48, although other means, such as, for example, adhesives, can be used to secure to the lining 44 to the elevator plate 26.

The elevator plate 26 also preferably includes a first sealing portion 45. In the preferred embodiment, the sealing portion 45 comprises a suitable O-ring 47 positioned within an annular groove 49 that is formed in the lining 44 (see also FIG. 1). The purpose and function of the sealing portion 45 will be described in more detail below.

With reference back to FIG. 2A, a wafer carrier, which is indicated generally by the reference number 50, is attached to the elevator plate 26. Preferably, the wafer carrier 50 is sized and dimensioned to simultaneously support at least two wafers 37. Therefore, in the preferred embodiment, the wafer carrier 50 consists of a pair of supports or prongs 52a, 52b that extend generally upward from the lining 44. The prongs 52a, 52b are preferably secured to the elevator plate 26 by fasteners 54 that extend through the elevator plate 26 and the lining 44. Each prong 52a, 52b includes two arms 56, 57 that extend towards the center of the elevator plate 26. Together, the first set of arms 56 form a first shelf 56 for a wafer and the second set of arms 57 form a second shelf 57 for a wafer. Thus, as shown in FIG. 2A, two wafers 37 can simultaneously rest on the first and second shelves 56, 57 of the wafer carrier 50.

Although the illustrated wafer carrier 50 comprises a pair of supports or prongs 52 with arms 56, 57, those of skill in the art will readily appreciate that the wafer carrier 50 can be formed in a variety of other ways, giving due consideration to the preference for providing simultaneous support for at least two wafers 37. However, the illustrated arrangement of the wafer carrier 50 is preferred because it efficaciously holds two wafers and yet it requires a minimal amount of parts and manufacturing. It should also be appreciated that some advantages and features of the present invention can be achieved with a wafer carrier 50 that is sized and dimensioned to support only one wafer 37 at a time.

With continued reference to FIG. 2A, the load lock 20 preferably includes a first inlet 58. A purge gas valve, which is indicated generally by the reference number 59, is connected to the purge gas inlet 58 and is configured to provide purge gas to the first chamber 22 of the load lock 20. Purge gas is removed from the first chamber 22 through a purge gas outlet preferably located at the lower region of the load lock 20. More specifically, a purge gas outlet can be formed by a passage 61 defined by the elevator shaft 40 and/or a passage 63 defined between the housing 42 and the elevator shaft 40. The purge gas valve 59, inlet 58 and outlet are conventional wafer processing components that are well known in the art. Preferably, the purge gas inlet 58 is located on a side of the first housing portion 28 such that when the platform is in the first position the purge gas is directed over the wafers 37 that are resting on the wafer carrier 50.

The load lock 20 also preferably includes a second opening 62 and a third opening 64, which are preferably formed within the upper portion of the load lock 20. A purge gas valve, which is indicated generally by the reference number 66, is connected to the second opening and is configured to provide purge gas to the auxiliary chamber 24.

The third opening 64 is connected to an auxiliary processing system 68, which is illustrated schematically.

The auxiliary processing system 68 preferably includes a passage 150 that is connected to a first branch 152 and a second branch 154. The first branch 152 is connected to a valve 155, which is, in turn, connected to a vacuum pump 156. The second branch 154 is also connected to a valve 157, which is connected to an auxiliary processing solution source 158. As will be described in more detail below, the auxiliary processing solution source 158 provides an auxiliary processing solution to the auxiliary chamber 24 after the elevator plate 24 is moved to the second position (i.e., the position illustrated in FIG. 2B). Preferably, the auxiliary processing solution source 158 is configured to provide at least one of several types of auxiliary processing solutions to the auxiliary chamber.

Figure 4:
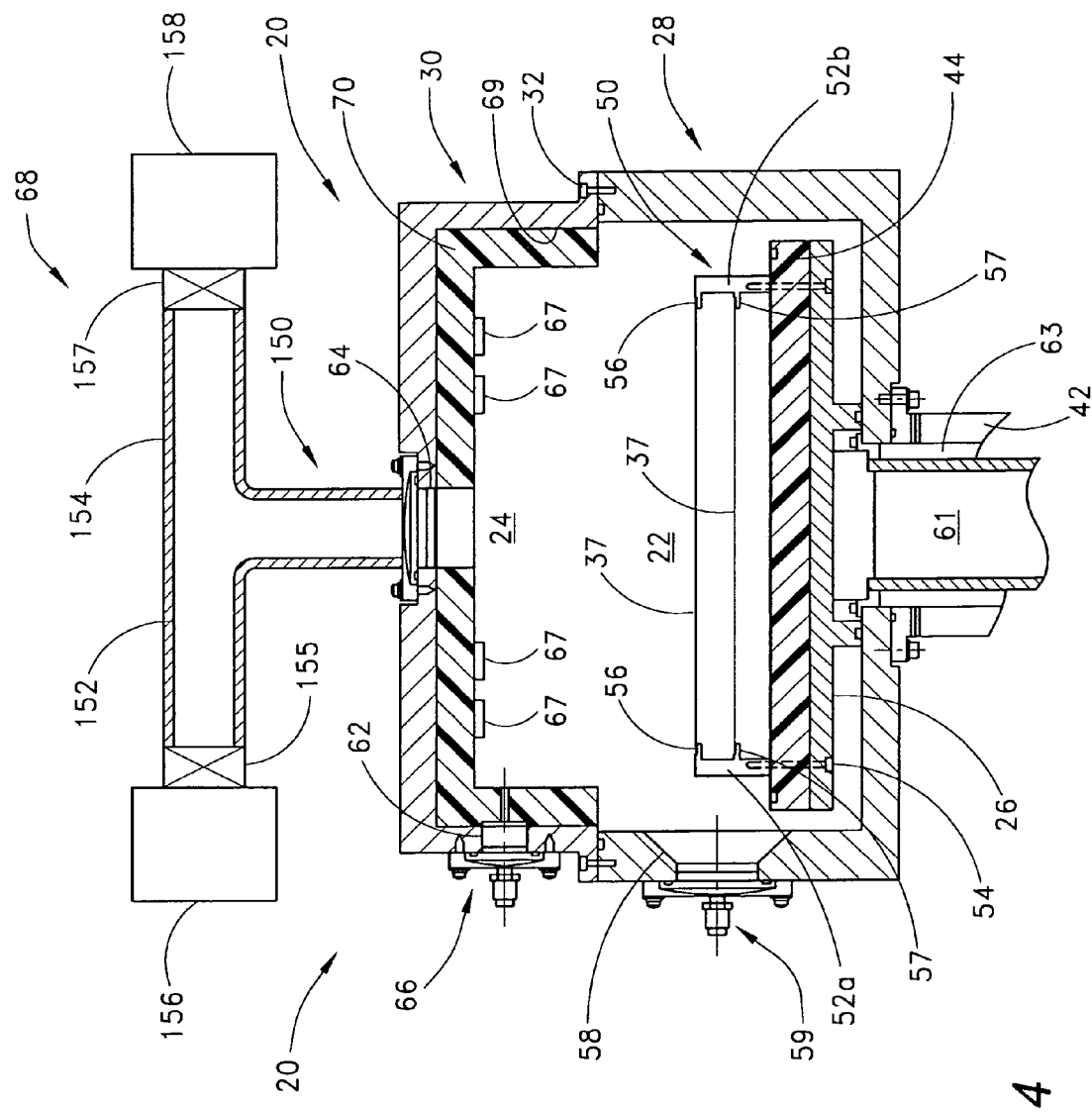
FIG. 4 is a cross-sectional view of a modified arrangement of a load lock having certain features and advantages according to the present invention.
Figure 5:
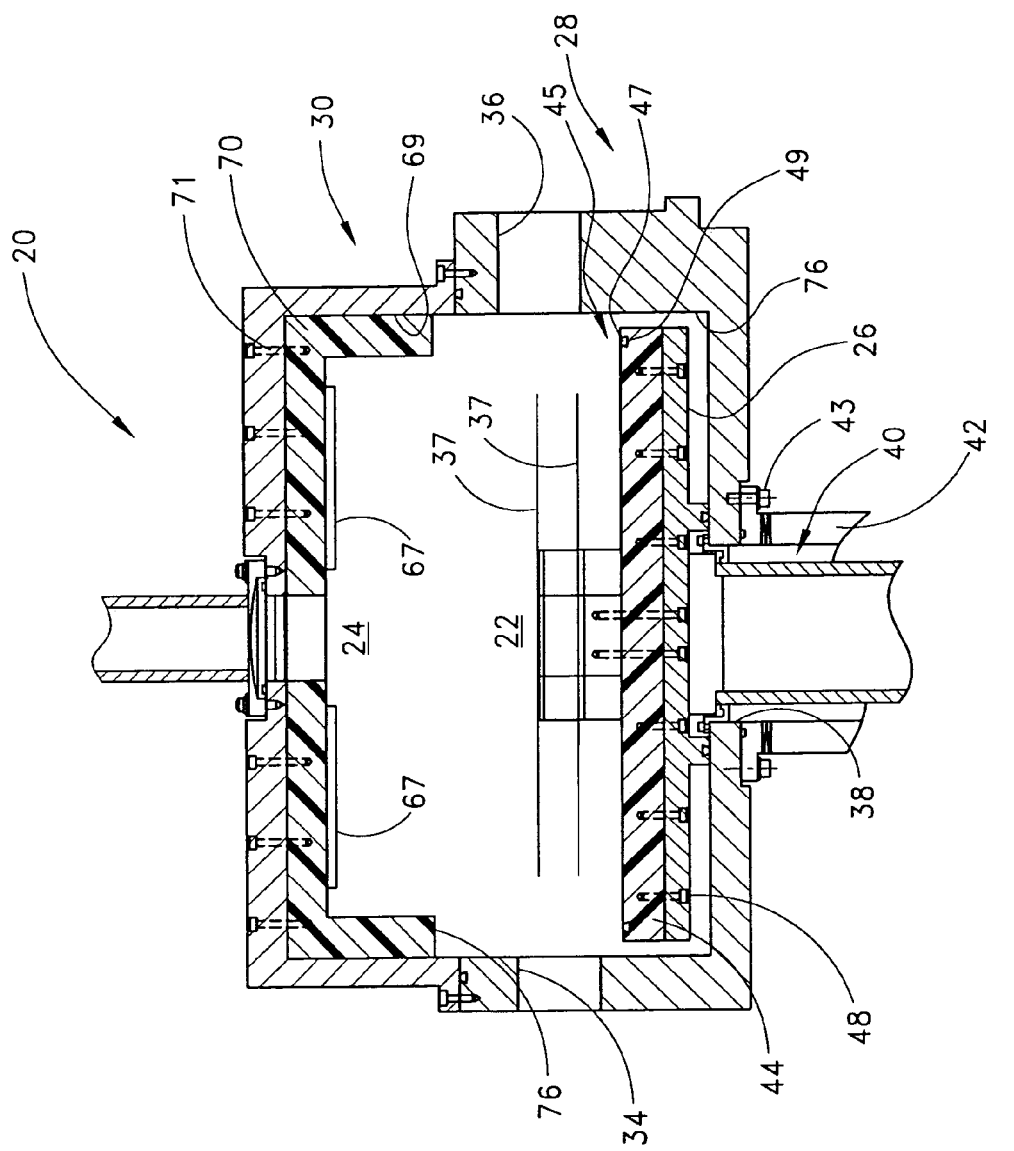
FIG. 5 is another cross-sectional view of the load lock of FIG. 4.

In addition to or instead of the components described above, the auxiliary processing system 68 can include heating elements 67 as illustrated in FIGS. 4 and 5. The heating elements 67 are preferably radiant heating elements 67 that are located in the auxiliary chamber 24. The heating elements 67 are particularly useful for heating a wafer 37 (in the position of FIG. 2B) to degas the wafer 37 prior to CVD/PVD processing. The degassed gases can be removed from the load lock 20 by the vacuum pump 156. In another arrangement, heating elements are located within the elevator plate 26 and/or the carrier 50. Exemplary heating elements for such an arrangement are resistive heaters.

With reference back to FIGS. 3A–3B, an inner surface 69 of the auxiliary chamber 24 is preferably covered, at least partially, by a lining 70. More preferably, the entire inner surface 69 of the auxiliary chamber 24 is covered by the lining 70. As with the lining 44 of the elevator plate 26, the lining 70 of the auxiliary chamber 24 is preferably made of Teflon® (i.e., polytetrafluoroethylene), although, other suitable non-reactive materials can also be used. The lining 70 is advantageously secured to the inner surface 69 by fasteners 71 so that it can be separated from the inner surface 69 and replaced if needed. However, it should be appreciated that the lining 70 can be made integrally with the load lock 20 and in particular the upper or auxiliary housing portion 30 of the load lock 20.

With particular reference to FIG. 3A, the load lock 20 also preferably includes a second sealing portion, which in the preferred embodiment comprises a lower surface 72 of the second lining 70. The first sealing portion 45 and the second sealing portion are configured such that when the elevator plate 26 is in the second position (see FIG. 3B) the auxiliary chamber 24 is substantially sealed from the first chamber 22. Thus, in the illustrated embodiment, the O-ring 47 seals against the lower surface 72 of the second lining 70 when the elevator plate 26 is in the second position. Accordingly, auxiliary process gases introduced into the auxiliary chamber 24, auxiliary process byproducts and/or gases desorbed from the wafer 37 are inhibited against entering the first chamber 22. This arrangement minimizes damage to the inner surface 76 of the first chamber 22 that can be caused by the aforementioned gases and solutions.

Although in the illustrated embodiment, the first and second sealing portions 45, 72 are formed by an O-ring 47 and the lower surface 72, those of skill in the art will readily appreciate that the sealing portions 45, 72 can be formed in a variety of other ways, giving due consideration to the aim of substantially sealing the auxiliary chamber 24 from the first chamber 22 when the elevator plate 26 is in the second position. For example, the second sealing portion can include an O-ring while the first sealing portion 45 can be formed by a groove formed in the lining 44 of the elevator plate 26. However, the illustrated arrangement is preferred because it efficaciously seals the auxiliary chamber 24 from the first chamber 22, and yet it requires a minimal amount of components.

With reference again to FIGS. 2A and 2B, an auxiliary processing process that utilizes the load lock 20 according to the illustrated arrangement will now be described. As mentioned above, when the elevator plate 26 is in the second position (FIG. 2B), the auxiliary chamber 24 is substantially sealed from the first chamber 22. To treat the wafer 37, the valve 155 is opened to apply a vacuum to the auxiliary chamber 24. The valve 155 is then closed and the valve 157 connecting the auxiliary processing solution source 158 is opened. Of course, those of skill in the art will recognize that in a modified arrangement the auxiliary process solution can be supplied to the auxiliary chamber 24 under pressure.

The auxiliary process fluid flows into the auxiliary chamber 24 through the second branch 154 and the passage 150. The linings 70, 44 of the auxiliary chamber 24 and the elevator plate 26 protect the load lock 20 from the auxiliary process gases. The seal formed by the elevator plate 26 also prevents the auxiliary process gases from damaging the first chamber 22 of the load lock 20. Once the wafer 37 is treated, the valve 157 to the auxiliary processing process gas source 158 is preferably closed and the valve 155 to the vacuum pump 156 is opened. The vacuum pump 156 removes the auxiliary process gases from the auxiliary chamber 24. The auxiliary chamber 24 can also be purged by supplying purge gas through the purge gas valve 66. The vacuum pump 156 can be used to remove the purge gas from the auxiliary-chamber 24.

The auxiliary process can be performed before the wafer is processed in a processing chamber (i.e., a pre-processing treatment). For example, the auxiliary process can be a cleaning process wherein the wafer 37 is cleaned before it is processed in the processing chamber. In such an arrangement, the auxiliary processing solution is a cleaning solution, such as, for example, hydrofluoric gas. Other suitable cleaning gases, such as, for example, $NF_3$, $HCl$, $ClF_3$, $F_3$, $SF_6$, $CF_4$, and $C_2$, $F_6$. can also be used to clean the wafer 37. In another arrangement, or in the same system, the wafer can be alternatively or additionally degassed prior to CVD or PVD depostion. In still another arrangement, the wafer surface can be alternatively or additionally prepared for subsequent deposition, particularly Atomic Layer Deposition (ALD), by exposure in the auxiliary chamber 24 to alcohols, carboxylic acids, ketones, etc. It should be appreciated that the above-described pre-processing treatments can also be performed in combination with each other and/or with the other treatments described below.

The wafer 37 can also be treated with an auxiliary process in the auxiliary chamber 24 after the wafer 37 is processed in the processing chamber (i.e., a post-processing treatment). For example, the wafer 37 can be oxidized in the auxiliary chamber 24. According to such an arrangement, the auxiliary solution preferably includes $O_3$ or $H_2O$, which are used to oxidize a processed wafer as is known in the art, forming a protective oxide layer over a deposited layer prior to exposure to the clean room. In another arrangement, the heating elements 67 (see FIGS. 4–5) can be used to heat the wafer 37 prior to CVD/PVD processing to degas the wafer 37. In a modified arrangement, the post-processing process is a measuring process. In such an arrangement, after processing, the wafer 37 can be measured, e.g., for thickness of a deposited layer or for particle contamination, such as with an in situ particle counter detecting light scatter. It will be noted that the above-described treatments can also be performed in combination with each other and/or the pre-processing treatments described above.

Figure 6A:
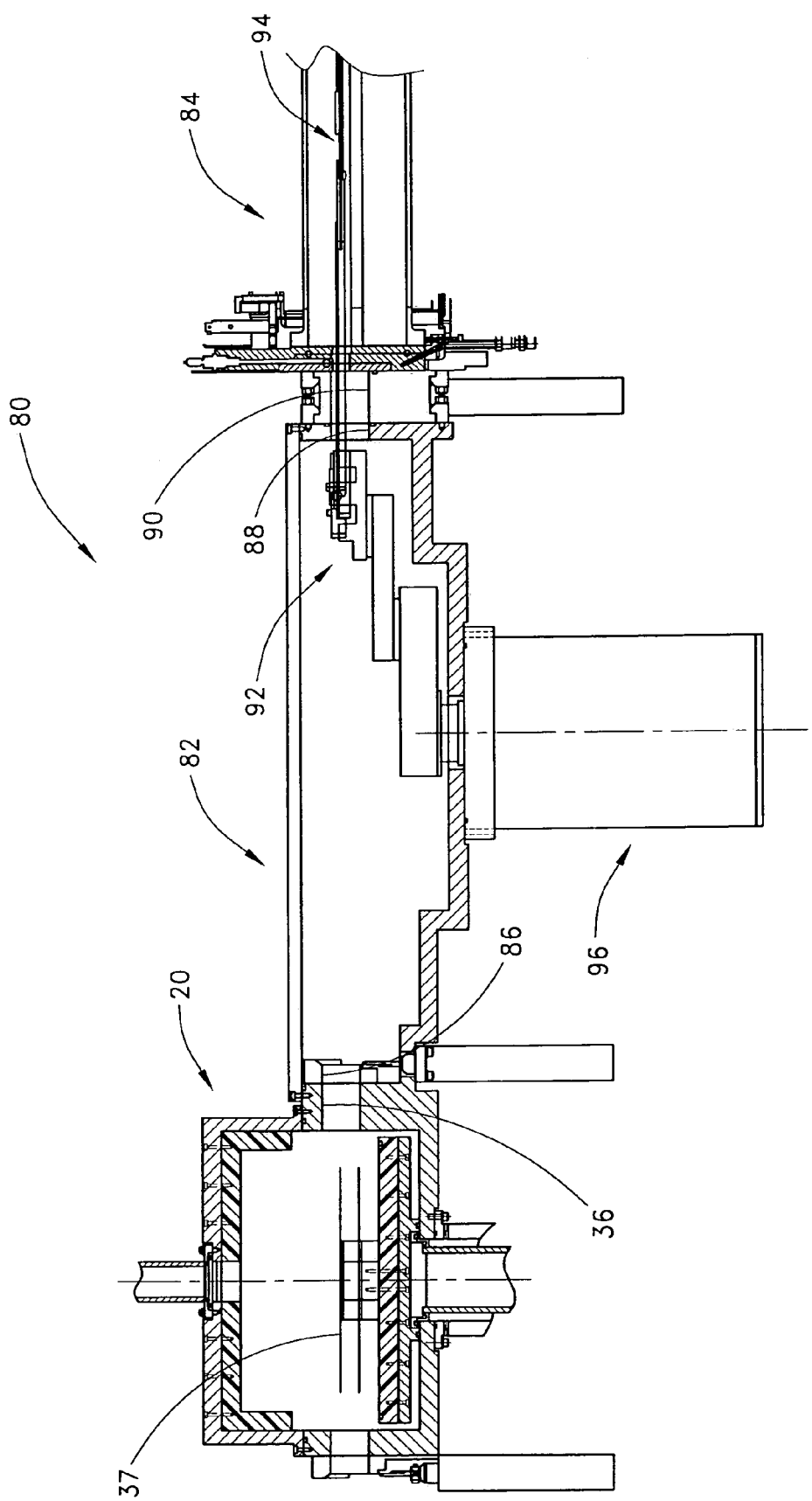
FIG. 6A is a cross-sectional view of a wafer processing system that includes a wafer handling module located between the load lock of FIG. 1 and a processing module.

FIG. 6A illustrates an exemplary processing station 80 that includes the load lock 20, a wafer handling module 82 and a processing module 84 (shown partially). In the exemplary processing system 80, the load lock 20 is directly connected to the wafer handling module 82. Accordingly, the handling module 82 includes a first port 86, which is aligned with the similarly sized handling module port 36 of the load lock 20. The handing module 82 is, in turn, connected to the processing module 84. The handling module 82 includes a second port 88, which is aligned with a similarly sized port 90 of the processing module 84.

The wafer handling module 82 also includes a wafer handler, which is indicated generally by the reference number 92, for translating wafers 37 to/from the load lock chamber 20 and to/from the processing chamber 84. The wafer handler 92 includes a simple paddle 94 augmented with a vacuum, such as, for example, the paddle disclosed in U.S. Pat. No. 4,951,601, which is herein expressly incorporated by reference. Movement of the wafer handler 92 is controlled by a driver 96, which is preferably controlled by a computer (not shown).

Figure 6B:
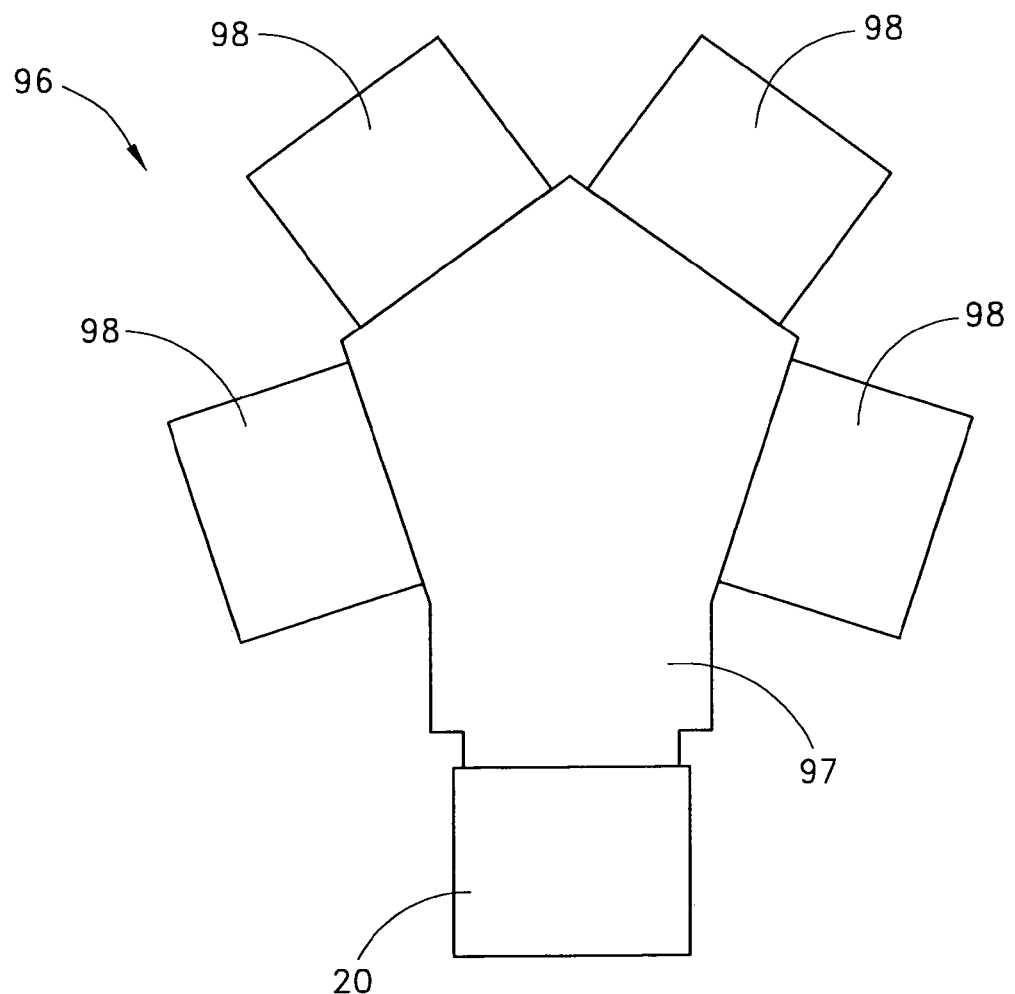
FIG. 6B is a schematic top plan view of a wafer processing system that includes a wafer handling module, the load lock of FIG. 1 and a plurality of processing modules.

While the load lock 20 of FIG. 6A is associated with a single processing module 84, certain features and advantages of the load lock 20 can also be achieved in a cluster type processing station, such as, for example, the cluster type processing station 96 that is schematically illustrated in FIG. 6B. As is typical in cluster-type processing stations, the load lock 20 is associated with multiple processing modules 98. A wafer handling module 97 includes a wafer handler (not shown) for translating wafers to and/or from the load chamber 20 and to, from and/or between the processing modules 98.

FIGS. 7A–H schematically illustrate the movement of wafers into and out of the load lock 20 (e.g., between the load lock 20 and a cassette or FOUP) and the movement of the elevator plate 26 within the load lock 20 in accordance with certain aspects and advantages of the present invention.

Figures 7A, 7B, 7C:
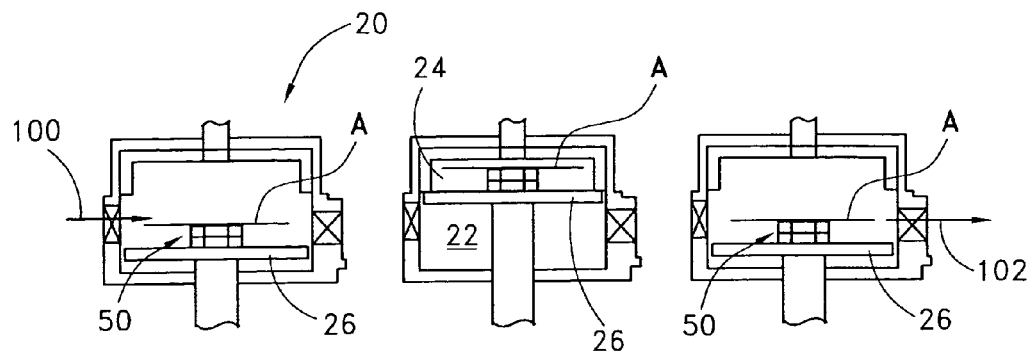
FIGS. 7A–7H is a schematic representation of a method for handling and processing wafers having certain features and advantages according to the present invention, using the load lock of FIG. 1.
Figures 7D, 7E, 7F:
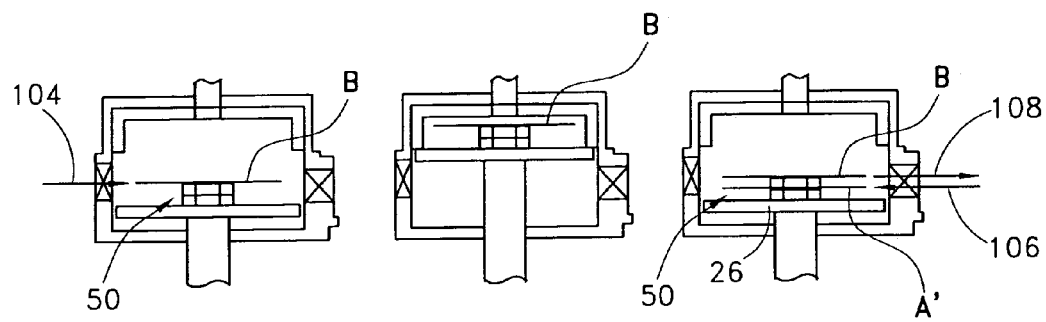

With initial reference to FIG. 7A, a robot (not shown) places a first wafer A onto the wafer carrier 50 as indicated by the arrow 100. In the preferred embodiment, the wafer A is placed upon the first shelf of the wafer carrier 50. Once the wafer A is in place, the It will be noted that the above-described treatments can also be performed in combination with each other and/or the pre-processing treatments described above.

FIG. 6A illustrates an exemplary processing station 80 that includes the load lock 20, a wafer handling module 82 and a processing module 84 (shown partially). In the exemplary processing system 80, the load lock 20 is directly connected to the wafer handling module 82. Accordingly, the handling module 82 includes a first port 86, which is aligned with the similarly sized handling module port 36 of the load lock 20. The handing module 82 is, in turn, connected to the processing module 84. The handling module 82 includes a second port 88, which is aligned with a similarly sized port 90 of the processing module 84.

The wafer handling module 82 also includes a wafer handler, which is indicated generally by the reference number 92, for translating wafers 37 to/from the load lock chamber 20 and to/from the processing chamber 84. The wafer handler 92 includes a simple paddle 94 augmented with a vacuum, such as, for example, the paddle disclosed in U.S. Pat. No. 4,951,601, which is herein expressly incorporated by reference. Movement of the wafer handler 92 is controlled by a driver 96, which is preferably controlled by a computer (not shown).

While the load lock 20 of FIG. 6A is associated with a single processing module 84, certain features and advantages of the load lock 20 can also be achieved in a cluster type processing station, such as, for example, the cluster type processing station 96 that is schematically illustrated in FIG. 6B. As is typical in cluster-type processing stations, the load lock 20 is associated with multiple processing modules 98. A wafer handling module 97 includes a wafer handler (not shown) for translating wafers to and/or from the load chamber 20 and to, from and/or between the processing modules 98.

FIGS. 7A–H schematically illustrate the movement of wafers into and out of the load lock 20 (e.g., between the load lock 20 and a cassette or FOUP) and the movement of the elevator plate 26 within the load lock 20 in accordance with certain aspects and advantages of the present invention.

With initial reference to FIG. 7A, a robot (not shown) places a first wafer A onto the wafer carrier 50 as indicated by the arrow 100. In the preferred embodiment, the wafer A is placed upon the first shelf of the wafer carrier 50. Once the wafer A is in place, the load lock 20 can be closed (e.g., by closing the load lock port 34) and the load lock 20 can be purged. If pre-processing treatment is desired the elevator plate 26 can be moved into the second position (see FIG. 7B). As explained above, in this position the elevator plate 26 substantially seals the auxiliary chamber 24 from the first chamber 22. The wafer A can now be pre-processed by injecting the auxiliary processing gas into the auxiliary chamber. Once the wafer A is pre-processed, the remaining gases are preferably removed from the auxiliary chamber 24 and the auxiliary chamber 24 is purged, as described above. The elevator plate 26 is lowered to the first position as indicated in FIG. 7C.

From the first position, the wafer A is removed from the load lock 20, as indicated by the arrow 102, and transferred to a processing chamber (not shown), such as, for example, the processing chamber 84 of FIG. 6A. Once the wafer A is removed from the wafer carrier 50, the robot places the second wafer B onto the wafer carrier 50 as indicated by the arrow 104 (see FIG. 7D). Preferably, the second wafer B is also placed upon the first shelf of the wafer carrier 50. Once the second wafer B is in place, the load lock 20 can be purged. If a pre-processing auxiliary process is desired, the elevator plate 26 is then moved to the second position (see FIG. 7E) and the second wafer B can be pre-processed as described above. Preferably, while the second wafer B is being pre-processed, the first wafer A is being processed in the process chamber. After the auxiliary process gases are removed from the auxiliary chamber 24 and the auxiliary chamber 24 is preferably purged, the elevator plate 26 is lowered to the first position (see FIG. 7F).

While the elevator plate 26 is in the first position, a processed wafer A' is returned to the second shelf of the wafer carrier 50 as indicated by the arrow 106. The second wafer B is also removed from the load lock 20 and transferred to the processing chamber as indicated by the arrow 108. Preferably, the processed wafer A', which is typically hot when it enters the load lock 20, is returned to the second shelf before the second wafer B is removed so that the processed wafer A' can cool while the second wafer B is being transferred to the processing module.

It should be appreciated that the processing system can be arranged such that the processed wafer A' is the first wafer A. This arrangement is most convenient when the load lock 20 is integrated into a stand-alone processing system. In such an arrangement, the first wafer A is processed while the second wafer B is being subjected to an auxiliary process in the auxiliary chamber 24. It should also be appreciated that the processing system can be arranged such that the processed wafer A' is a wafer that was admitted into the load lock before the first wafer A. This arrangement is most convenient when the load lock 20 is integrated into a cluster-type processing system. In such an arrangement, several wafers are being processed while the second wafer is being subjected to an auxiliary process in the auxiliary chamber 22.

After the wafer B has been transferred to the processing chamber, the processed wafer A' can be post-processed in the auxiliary chamber 24. In such an arrangement, the elevator plate 26 is moved into the second position. As explained above, in this position the elevator plate 26 substantially seals the auxiliary chamber 24 from the first chamber 22. The wafer A can now be post-processed by injecting the auxiliary gases into the auxiliary chamber 24 and/or by heating the wafer B with heating elements. Once the processed wafer A' is post-processed, the gases are removed from the auxiliary chamber 24 and the auxiliary chamber 24 is preferably purged, as described above.

Figures 7G, 7H:
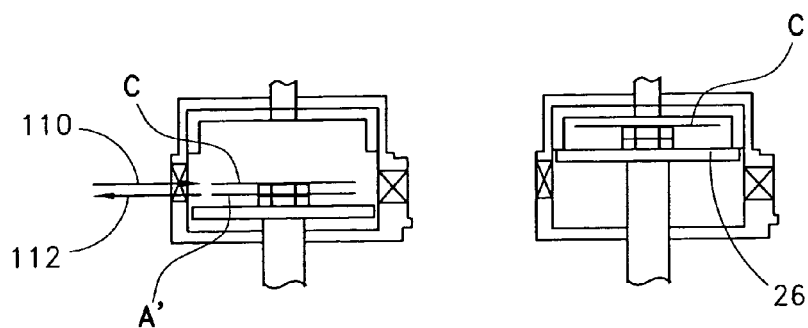

With the elevator plate 26, in the first position, a third wafer C is preferably placed onto the first shelf of the wafer carrier 50 as indicated by the arrow 110 (FIG. 7G). The processed wafer A' can then be removed from the load lock 20 as indicated by the arrow 112. However, it should be appreciated that the processed wafer A' can be removed before the third wafer C is placed into the load lock 20. Nevertheless, placing the third wafer C in the load lock 20 first is preferred because it provides additional time for the processed wafer A' to cool. As shown in FIG. 7H, once the processed wafer A' has been removed, the elevator plate 26 can be raised and the steps described above can be repeated.

Figure 8:
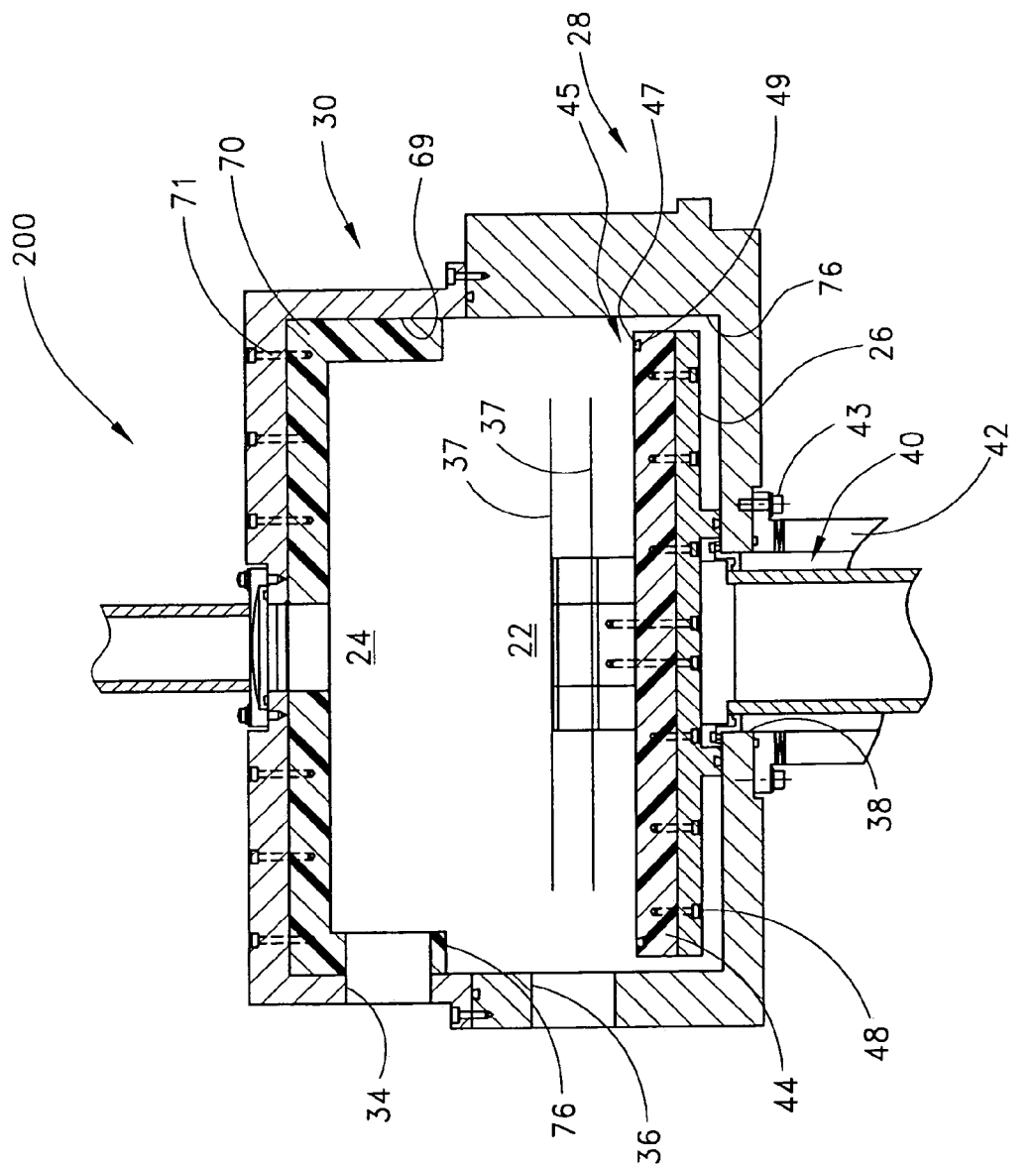
FIG. 8 is a cross-sectional view of another modified arrangement of a load lock having certain features and advantages according to the present invention.

FIG. 8 illustrates a modified arrangement of a load lock 200 having certain features and advantages according to the present invention. Features of the second embodiment corresponding to those of the first embodiment are referenced by the same reference numerals. In this arrangement, the load lock port 34 is arranged on the load lock 200 such that it directly communicates with the auxiliary chamber 24. More preferably, the load lock port 34 is located in the auxiliary housing portion 30 of the load lock 200. The handling chamber port 36, which is also sufficiently wide to allow transport of wafers 37 therethrough, preferably communicates directly with the first chamber 22. More preferably, the handling chamber port 36 is located in the first housing portion 28 of the load lock 200. The illustrated arrangement is preferred when employing the auxiliary chamber for pre-processing.

FIGS. 9A–E schematically illustrate the movement of wafers into and out of the modified load lock 200 and the movement of the elevator plate 26 within the load lock 200. With initial reference to FIG. 9A, a robot (not shown) places a first wafer A' onto the wafer carrier 50 as indicated by the arrow 100. In the preferred embodiment, the elevator plate 26 is already in the second position and the elevator plate 26 substantially seals the auxiliary chamber 24 from the first chamber 22. Once the wafer A is in place, the load lock 200 can be closed (e.g., by closing the load lock port 34) and the load lock 200 can be purged. The wafer A can now be pre-processed by injecting the auxiliary processing solution into the auxiliary chamber 24. Once the wafer A is pre-processed, the remaining gases are preferably removed from the auxiliary chamber 24 and the auxiliary chamber 24 can be purged, as described above. The elevator plate 26 is lowered to the first position as indicated in FIG. 9B.

From the first position, the wafer A is removed from the load lock 200, as indicated by the arrow 102, and transferred to a processing chamber (not show). Once the wafer A is removed from the wafer carrier 50, the elevator plate 26 returns to the second position and the robot places a second wafer B onto the wafer carrier 50 as indicated by the arrow 104 (see FIG. 9C). Preferably, the second wafer B is also placed upon the first shelf of the wafer carrier 50. Once the second wafer B is in place, the load lock 200 can be purged. If pre-processing is desired, the second wafer B can be pre-processed as described above. Preferably, while the second wafer B is being pre-processed, the first wafer A is being, processed in the process chamber. After the auxiliary gas is removed from the auxiliary chamber 24 and the auxiliary chamber 24 is preferably purged, the elevator plate 26 is lowered to the first position (see FIG. 9D).

While the elevator plate 26 is in the first position, a processed wafer A' is returned to the second shelf of the wafer carrier 50 as indicated by the arrow 106. The second wafer B is also removed from the load lock 20 and transferred to the processing chamber as indicated by the arrow 108. Preferably, the processed wafer A', which is typically hot when it enters the load lock 200, is returned to the second shelf before the second wafer B is removed so that the processed wafer A' can cool while the second wafer B is being transferred to the processing module. As with the previous arrangement, it should be appreciated that the processing system can be arranged such that the processed wafer A' is the first wafer A or a wafer that was admitted into the load lock before the first wafer A.

After the wafer B has been transferred to the processing chamber, the elevator plate 26 is moved into the second position (FIG. 9E). In this position, the processed wafer A' can be post-processed in the auxiliary chamber 24. With the elevator plate 26 in the second position, a third wafer C is preferably placed onto the first shelf of the wafer carrier 50 as indicated by the arrow 110. The processed wafer A' can then be removed from the load lock 200 as indicated by the arrow 112. However, it should be appreciated that the processed wafer A' can be removed before the third wafer C is placed into the load lock 200. Nevertheless, placing the third wafer C in the load lock 20 first is preferred because it provides additional time for the processed wafer A' to cool. Once the processed wafer A' has been removed, the third wafer C can be pre-processed in the second position and the process described above can be repeated.

FIGS. 10A–F illustrate another modified arrangement of a load lock 300 having certain features and advantages according to the present invention, wherein like reference numerals are employed. In this arrangement, the load lock port 34 is arranged on the load lock 20 such that it directly communicates with the first chamber 22 (see FIG. 10B). More preferably, the load lock port 34 is located in the first housing portion 28 of the load lock 300. In addition, the handling chamber port 36, communicates directly with the auxiliary chamber 24 (see FIG. 10A). More preferably, the handling chamber port is located in the auxiliary housing portion 30 of the load lock 300. The illustrated arrangement is particularly preferred where post-processing is desired in the auxiliary chamber 22.

In use, a robot (not shown) places a first wafer A onto the wafer carrier 50 as indicated by the arrow 100 (see FIG. 10A). The wafer A is preferably placed upon the second shelf of the wafer carrier 50. Once the wafer A is in place, the load lock 20 can be closed (e.g., by closing the load lock port 34) and the load lock 20 can be purged. The elevator plate 26 is then moved into the second position (see FIG. 10B) wherein the elevator plate 26 substantially seals the auxiliary chamber 24 from the first chamber 22. If pre-processing is desired, the wafer A can be pre-processed in the auxiliary chamber as described above. Once the wafer A is pre-processed, if desired, the remaining gases can be removed from the auxiliary chamber 24 and the auxiliary chamber 24 can be purged, as described above.

With the elevator plate 26 in the second position, the wafer A is removed from the load lock 20, as indicated by the arrow 102, and transferred to a processing chamber (not shown). (see FIG. 10B) Once the wafer A is removed from the wafer carrier 50, the elevator plate 26 is lowered to the first position (see FIG. 10C). The robot then places the second wafer B onto the wafer carrier 50 as indicated by the arrow 104. Preferably, the second wafer B is also placed upon the second shelf of the wafer carrier 50. Once the second wafer B is in place, the load lock 20 can be purged. The elevator plate 26 is then moved to the second position (see FIG. 10D). The second wafer B can be pre-processed if desired, in which case the second wafer B is being pre-processed, the first wafer A is being processed in the process chamber. The auxiliary chamber 24 is then preferably purged.

While the elevator plate 26 is in the second position, a processed wafer A' is returned to the load lock 300 as indicated by the arrow 106 (see FIG. 10D). Preferably, the processed wafer A' is placed on the first shelf of the wafer carrier 50. The second wafer B is then removed from the load lock 20 and transferred to the processing chamber as indicated by the arrow 108. The processed wafer A' is preferably returned to the first shelf before the second wafer B is removed so that the processed wafer A' can cool while the second wafer B is being transferred to the processing module. As with the previous arrangements, the processing system the processed wafer A' can be the first wafer A or a wafer that was admitted into the load lock before the first wafer A.

After the wafer B has been transferred to the processing chamber, the processed wafer A' is preferably post-processed in the auxiliary chamber. Once the processed wafer A' is post-processed, the auxiliary chamber 24 is preferably purged. The elevator plate 26 is then lowered to the first position (see FIG. 10E). With the elevator plate 26 in the first position, a third wafer C is placed preferably onto the second shelf of the wafer carrier 50 as indicated by the arrow 110. The processed wafer A' can then be removed from the load lock 300 as indicated by the arrow 112. However, it should be appreciated that the processed wafer A' can be removed before the third wafer C is placed into the load lock 300. Nevertheless, placing the third wafer C in the load lock 20 first is preferred because it provides additional time for the processed wafer A' to cool. As shown in FIG. 10F, once the processed wafer A' has been removed, the elevator plate 26 is moved to the second position and the steps described above can be repeated.

Figure 11A:
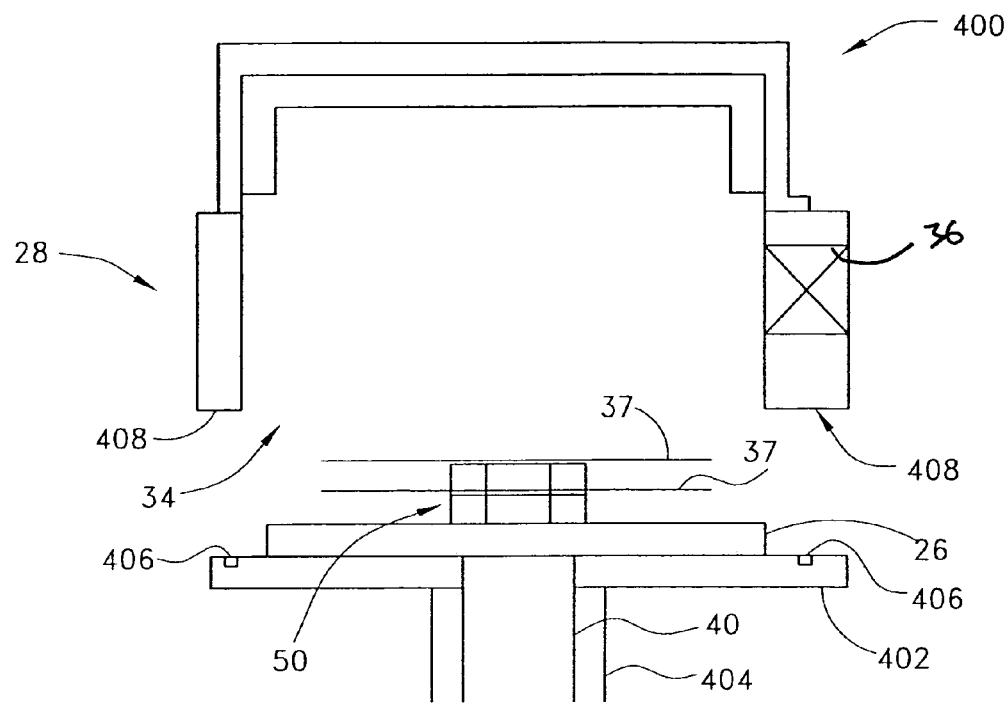
FIGS. 11A–C is a schematic cross-sectional view of yet another modified arrangement of a load lock having certain features and advantages according to the present invention.
Figure 11B:
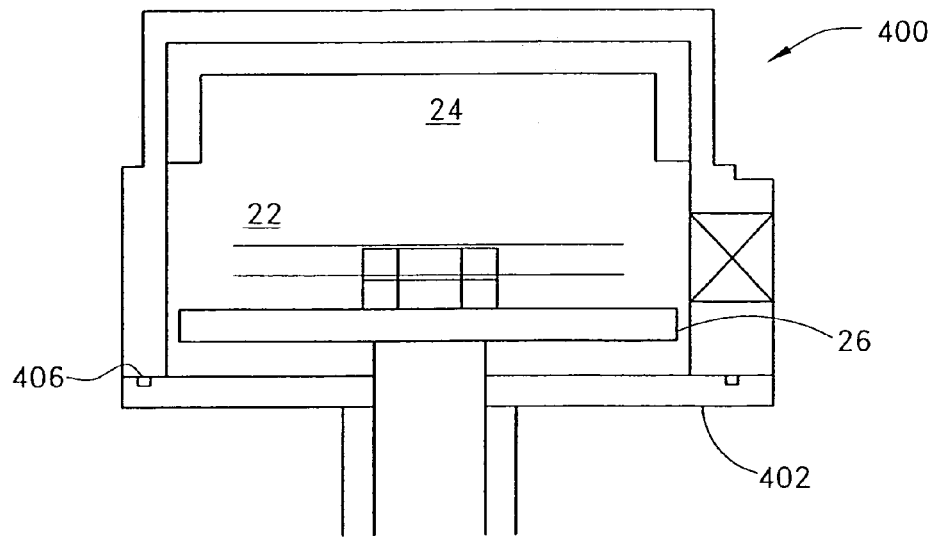
Figure 11C:
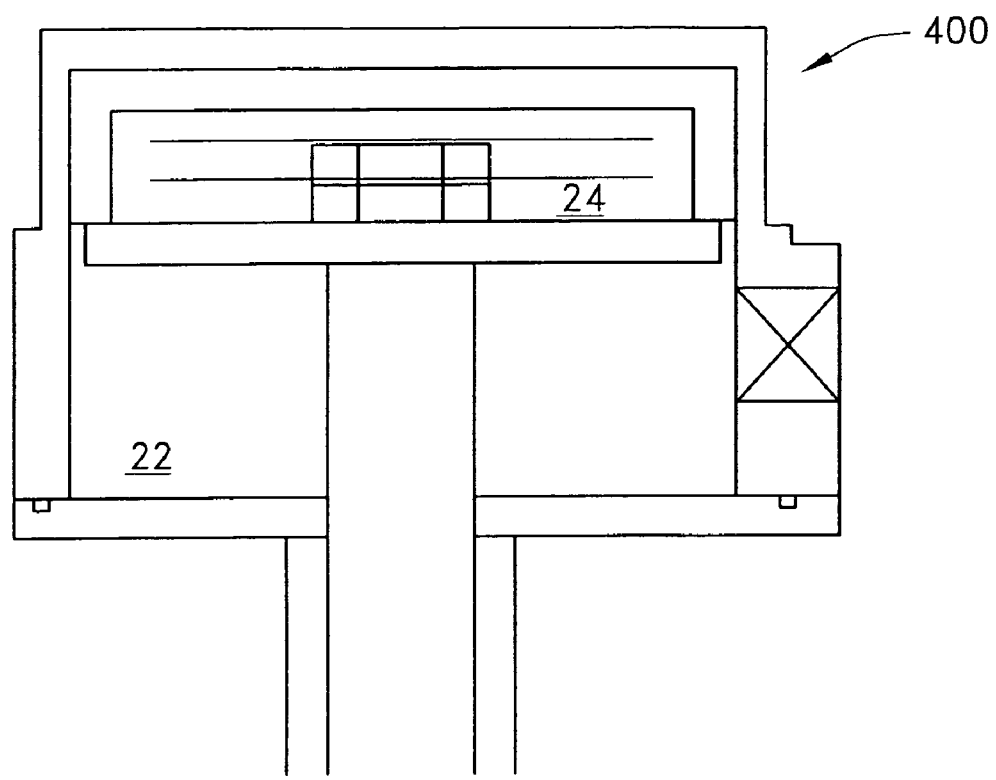

FIGS. 11A–C schematically illustrate yet another modified arrangement of a load 400 having certain features and advantages according to the present invention. In this arrangement, the load lock port 34 is configured to permit the passage of the wafer carrier 50 therethrough. The load lock 400 also includes a second plate 402, which is coupled to a second elevator shaft 404. The elevator shaft 404 is, in turn, coupled to the elevator drive mechanism (not shown). Preferably, the second elevator shaft 404 is positioned concentrically around the first elevator shaft 40.

The elevator mechanism moves the second elevator plate 402 between an outside position where the wafer carrier 50 is located outside the load lock 400 (see FIG. 1A) and a sealed position where the wafer carrier 50 is located within the load lock 400 (see FIG. 11B). In this sealed position, the second elevator plate 402 substantially closes the load lock port 34. Preferably, the second elevator plate 402 includes a sealing portion 406, which cooperates with a corresponding sealing portion 408 formed on the load lock 400 to substantially seal the load lock port lock port 34.

After the load lock port 34 is closed, the elevator mechanism can move the elevator plate 26 between the first position (see FIG. 11B) and the second position (see FIG. 11C). Accordingly, the load lock 400 can be operated in the manner described above. In the illustrated arrangement, the handling chamber port 36 is located on the first housing portion 28 of the load lock 400; however, the handling chamber port 36 can also be located on the auxiliary housing portion 30 of the load lock 400.

Figure 12:
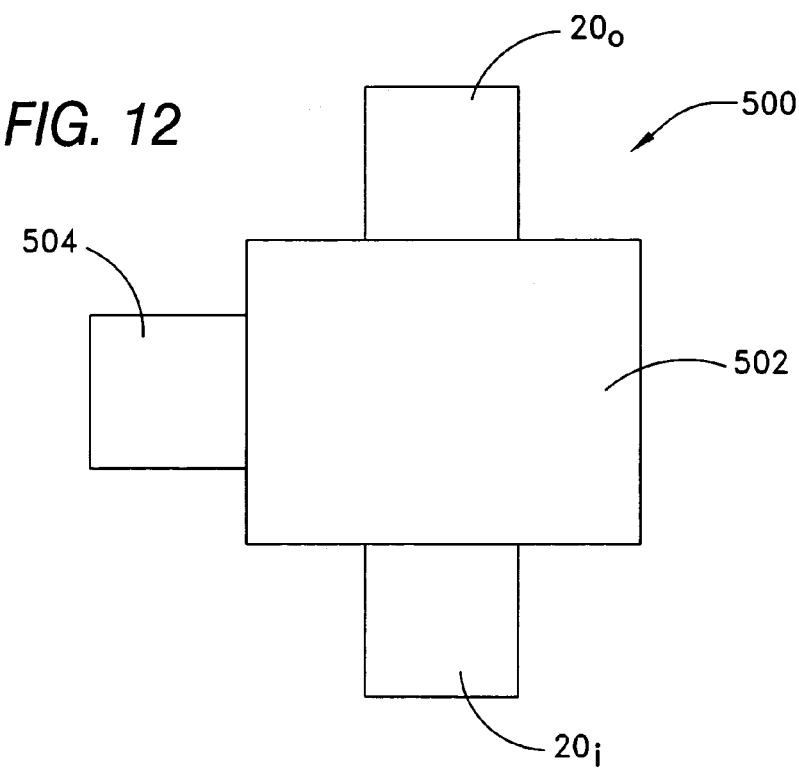
FIG. 12 is a schematic top plan view of a wafer processing system that includes a wafer handling module, an inlet load lock, an outlet load lock and a processing module.
Figure 13:
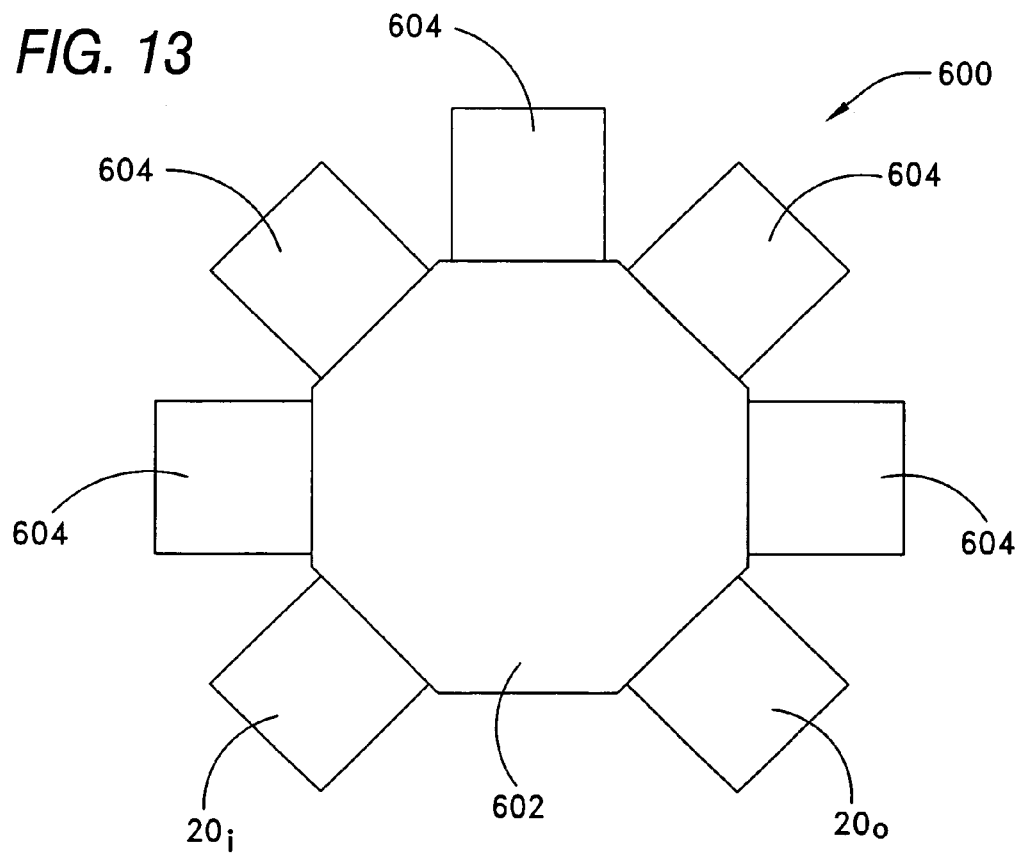
FIG. 13 is a schematic top plan view of a wafer processing system that includes a wafer handling module, an inlet load lock, an outlet load lock and a plurality of processing modules.

FIGS. 12 and 13 schematically illustrate modified arrangements of a processing station 500, 600 having certain features and advantages according to the present invention. In the previous arrangements, the illustrated processing stations included a single load lock 20 (see FIGS. 6A and 6B) from which wafers entered and exited the processing station. In contrast, the processing stations of FIGS. 12 and 13 include two load locks, an inlet load lock 20*i* and an outlet load lock 20*o*, that are configured as described above.

In FIG. 12, the processing station 500 includes the inlet load lock 20*i*, a wafer handling module 502, a processing module 504, and the outlet load lock 20*o*. The wafer handling module 502 includes a wafer handler that is configured for translating wafers from the inlet load lock 20*i* to the processing module 504 and from the processing module 504 to the outlet load lock 20*o*.

In use, a robot preferably transfers a first wafer to the inlet load lock 20*i*. The first wafer can then be pre-processed in the auxiliary chamber 24, as described above. After pre-processing, the wafer handler transfers the first wafer to the processing module 504. While the first wafer is being processed in the processing module 504, a second wafer is preferably transferred to the inlet load lock 20*i* and pre-processed in the auxiliary chamber 24.

After the first wafer is processed, the wafer handler transfers the first wafer to the outlet load lock 20*o*. Once inside the outlet load lock 20, the first wafer can be post-processed in the auxiliary chamber 24, as described above. Preferably, the wafer is being post-processed while a second wafer (which is transferred to the process module 504) is being processed. After the first wafer is processed, a second robot preferably removes the first wafer from the outlet load lock 20*o*. Preferably, the second wafer is then transferred to the outlet load lock 20*o*.

FIG. 13 illustrates a cluster-type processing station 600 that also includes an inlet and outlet load lock 20*i*, 20*o*. The processing station 600 further includes a wafer handling module 602 and a plurality of processing modules 604. The wafer handling module 602 includes a wafer handler (not shown) for translating wafers from the inlet load lock 20*i* and to/between the processing modules 604. The wafer handling module 602 also transfers the wafers from the processing modules 604 to the outlet load lock 20*o*.

In use, a robot (not shown) preferably transfers a first wafer (not shown) to the inlet load lock 20*i*. The first wafer can then be pre-processed in the auxiliary chamber 24, as described above. After pre-processing, the wafer handler transfers the first wafer to one of the processing modules 604. While the first wafer is being processed in one of the processing module 604, a second wafer is preferably transferred to the inlet load lock 20*i* and pre-processed in the auxiliary chamber 24.

After the first wafer is processed, the wafer handler transfers the first wafer to the outlet load lock 26*o*. Once inside the outlet load lock 20, the first wafer can be post-processed in the auxiliary chamber 24. Preferably, the wafer is being post-processed while a second wafer (which has been transferred to one of the process modules 604) is being processed. After the first wafer is processed, a second robot preferably removes the first wafer from the outlet load lock 20*o*. Preferably, the second wafer is then transferred to the outlet load lock 20*o*.

The arrangements of the load lock described above have several advantages over the prior art. For example, a load lock according to the present invention allows an auxiliary process to be added to an existing wafer processing station without adding to the footprint of the existing processing system. That is, because the auxiliary chamber 24 lies above the first chamber 24, the load lock 20 does not increase the floor space occupied by the processing station.

Another advantage of the present invention is that the auxiliary process can be added to an existing wafer processing station with little or no effect on throughput. This can be accomplished because the auxiliary process can be done while another wafer is being processed in the processing chamber. Thus, even in a stand alone type configuration (see FIG. 6A), two different processes (e.g., cleaning or oxidizing) can be carried out without significantly adding to the overall process time of the wafer. Similarly, in a cluster type processing station (see FIG. 6B), an auxiliary processing step can be added without replacing a processing module as is typically required in the prior art. Moreover, when the wafer carrier is configured to hold at least two wafers, a place is provided for the processed wafer to cool while another wafer is being transferred to the processing module and/or being loaded into the load lock. In addition, in processing stations that include two or more load locks (see FIGS. 12 and 13), each load lock can perform an auxiliary process. Accordingly, at least two additional processes can be carried out without significantly adding to the overall process time.

Figure 14:
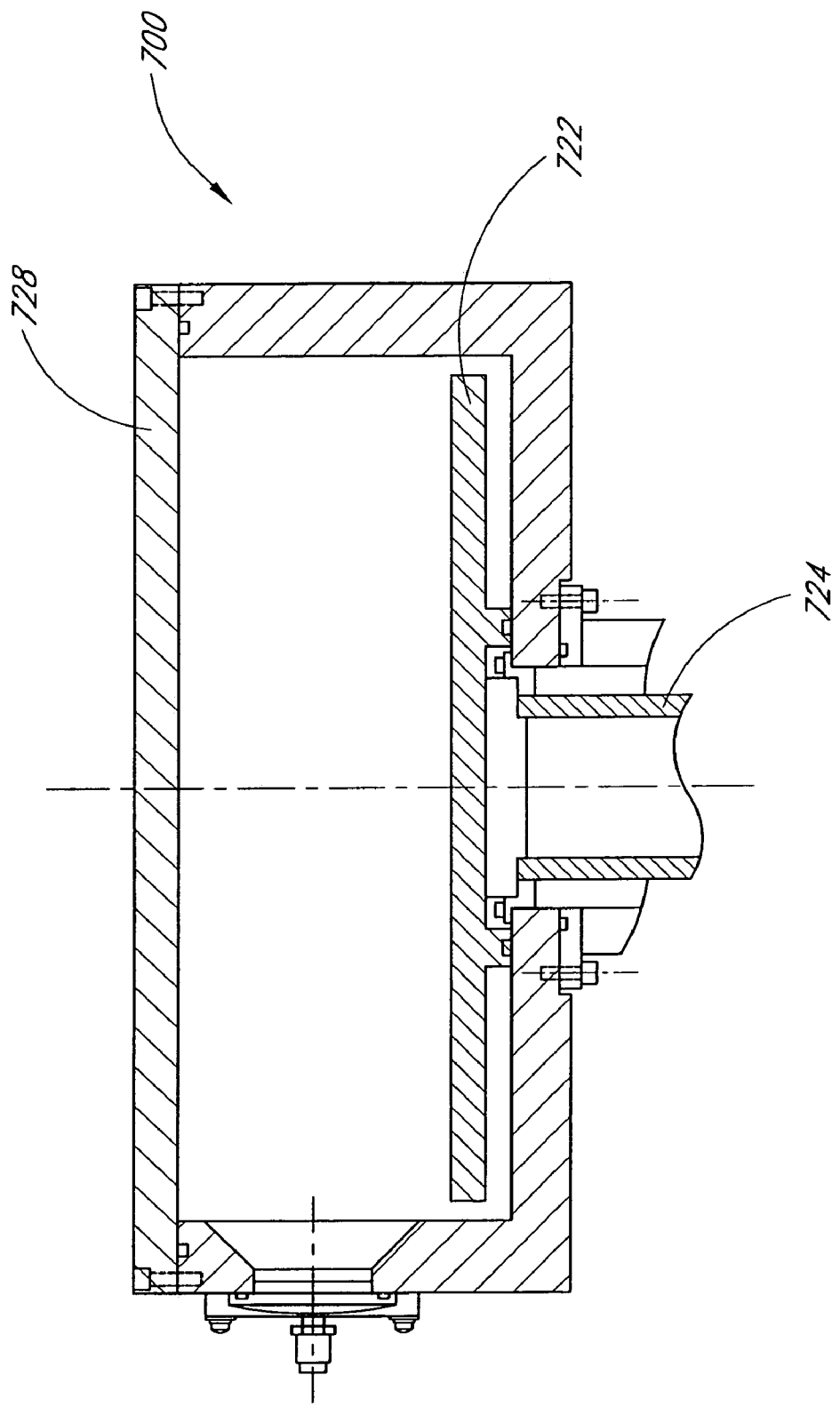
FIG. 14 is a cross-sectional view a prior art load lock and elevator plate.

Yet another advantage of the present invention is that the load lock 20 can be formed from an existing wafer load lock. For example, FIG. 14 illustrates a load lock 700 with an elevator plate 722 that is connected to an elevator shaft 724. A load lock having certain features and advantages according to the present invention can be formed from the load lock 700 by replacing the top 728 of the load lock 120 with the upper housing portion 30 (see FIG. 2A) of the load lock 20 of FIGS. 1–3B. The existing elevator plate and wafer carrier can then be replaced with the elevator plate 26 and wafer carrier 50 described above. Once the load lock 120 is modified, the existing wafer handling system of the processing station does not have to be significantly modified because only the sequence of operation has to be revised to accomplish the auxiliary process. Moreover, even after the load lock 120 is modified to include the auxiliary process capability, the wafer processing station can still be operated without including the auxiliary process.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Moreover, although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A system for processing substrates, comprising
a load lock chamber including a lower portion having a first inner width and an upper portion having a narrower second inner width, the chamber including a first port and a second port, each of the ports sized to pass substrates therethrough, the load lock chamber further comprising a moveable platform configured to support at least one substrate thereon and sized to have a width less than the first inner width and greater than the second inner width to enable selectively sealing the upper portion with the at least one substrate supported thereon;
a substrate handling chamber selectively communicating with the load lock chamber through the first port; and
at least one process chamber selectively communicating with the substrate handling chamber, wherein the first port is located in the upper portion.

2. A system for processing substrates, comprising
a load lock chamber including a lower portion having a first inner width and an upper portion attached to the lower portion and having a narrower second inner width, the chamber including a first port and a second port, each of the ports sized to pass substrates therethrough, the load lock chamber further comprising a moveable platform configured to support at least one substrate thereon and sized to have a width less than the first inner width and greater than the second inner width to enable selectively sealing the upper portion with the at least one substrate supported thereon;
an auxiliary processing system selectively communicating with an opening in the upper portion;
a substrate handling chamber selectively communicating with the load lock chamber through the first port; and
at least one process chamber selectively communicating with the substrate handling chamber, wherein said first port opens into said upper portion and said second port opens into said lower portion.

3. The system of claim 1, further comprising a substrate carrier that is attached to said moveable platform.

4. The system of claim 1, further comprising a substrate carrier on said moveable platform, the substrate carrier being adapted to receive at least a pair of substrates.

5. The system of claim 4, wherein said substrate carrier is located on top of said moveable platform and said moveable platform is configured to move vertically in said load lock chamber.

6. The system of claim 1, wherein the upper portion includes treatment gas injectors that communicate with a source of HF vapor.

7. The system of claim 1, wherein the upper portion includes treatment gas injectors that communicate with an oxidant source.

8. The system of claim 1, wherein said load lock chamber further includes heating elements.

9. The system of claim 8, wherein said heating elements are located within said upper portion.

10. The system of claim 2, further comprising a substrate carrier that is attached to said moveable platform.

11. The system of claim 2, further comprising a substrate carrier on said moveable platform, the substrate carrier being adapted to receive at least a pair of substrates.

12. The system of claim 11, wherein said substrate carrier is located on top of said moveable platform and said moveable platform is configured to move vertically in said load lock chamber.

13. The system of claim 2, wherein the upper portion includes treatment gas injectors that communicate with a source of HF vapor.

14. The system of claim 2, wherein the upper portion includes treatment gas injectors that communicate with an oxidant source.

15. The system of claim 2, wherein said load lock chamber further includes heating elements.

16. The system of claim 15, wherein said heating elements are located within said upper portion.

* * * * *